(12) United States Patent
Rohani et al.

(10) Patent No.: US 7,564,311 B2
(45) Date of Patent: Jul. 21, 2009

(54) METHOD AND APPARATUS TO ENHANCE LINEARITY AND EFFICIENCY IN AN RF POWER AMPLIFIER

(75) Inventors: Nader Rohani, Scottsdale, AZ (US);
Hongtao Xu, Beaverton, OR (US);
Yulin Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/904,864

(22) Filed: Sep. 28, 2007

(65) Prior Publication Data

US 2009/0085669 A1 Apr. 2, 2009

(51) Int. Cl.
*H03G 3/10* (2006.01)
(52) U.S. Cl. ...................................... 330/285; 330/296
(58) Field of Classification Search .................. 330/285, 330/296, 302, 310, 150, 98
See application file for complete search history.

(56) References Cited

U.S. PATENT DOCUMENTS 7,193,471 B2 * 3/2007 Tsutsui et al. ............... 330/285
7,215,203 B2 * 5/2007 Matsunaga et al. .......... 330/285
2007/0268074 A1 * 11/2007 Vejzovic ..................... 330/296

* cited by examiner

*Primary Examiner*—Henry K Choe
(74) *Attorney, Agent, or Firm*—The Law Offices of John C. Scott, LLC; John C. Scott

(57) ABSTRACT

Dynamic biasing techniques are used to enhance both linearity and efficiency within a transistor power amplifier. In at least one embodiment, as the power level being processed by a transistor increases toward a saturation point, a transistor is moved from class B or class AB operation toward class A operation. This increases the linearity of operation (because class A operation is typically highly linear) without a corresponding decrease in efficiency (because efficiency typically peaks near saturation). Similarly, as the power level decreases from the saturation point, the transistor is moved from class A or class AB operation toward class B operation. This increases the efficiency (because class B operation is more efficient than class A or AB), while having little effect on linearity (because operation is moving away from saturation).

19 Claims, 5 Drawing Sheets

METHOD AND APPARATUS TO ENHANCE LINEARITY AND EFFICIENCY IN AN RF POWER AMPLIFIER

TECHNICAL FIELD

The invention relates generally to power amplifiers and, more particularly, to techniques for enhancing power amplifier linearity and efficiency.

BACKGROUND OF THE INVENTION

RF power amplifiers within high speed wireless communication equipment usually consume a significant percentage of the power consumption and linearity budgets of the equipment. As the demand for data throughput increases, systems are requiring even more linear power amplifiers to broadcast high peak-to-average transmissions. However, highly linear power amplifiers typically exhibit low power efficiency and therefore consume more DC power than less linear amplifiers. This efficiency is reduced even further when the power amplifier output is backed off from its peak value. There is a need for power amplifier designs that are capable of achieving high linearity with better efficiency.

DETAILED DESCRIPTION

Figure 1:
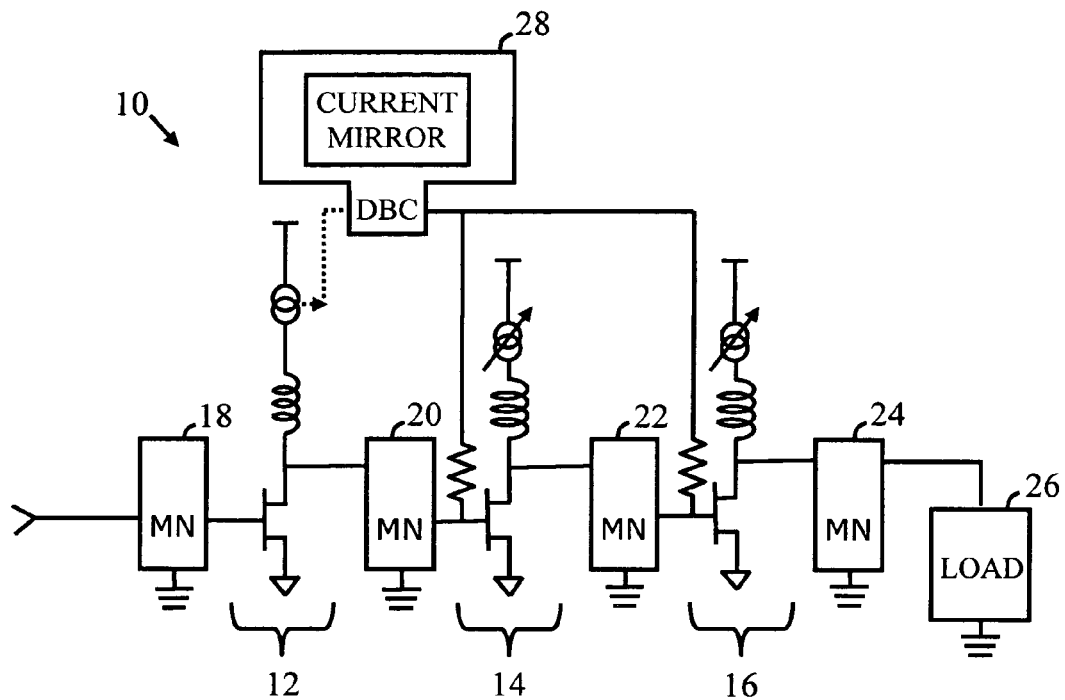
FIG. 1 is a block diagram illustrating an example power amplifier using adaptive dynamic bias control in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a block diagram illustrating an example power amplifier 10 in accordance with an embodiment of the present invention. The power amplifier 10 is a three stage amplifier having a pre-driver stage 12, a driver stage 14, and a final stage 16. Each stage of the power amplifier includes one or more power transistors. Any type of power transistors may be used including, for example, FETs, CMOS, pHEMT, BJTs, and/or others. As shown, the power amplifier 10 includes an input matching network 18 to provide an impedance match at an input thereof. The power amplifier 10 also includes an output matching network 24 to match the output of the amplifier 10 to a load 26. When the power amplifier 10 is used in a wireless transmitter, the load 26 may include an antenna (e.g., a dipole, a patch, a helical antenna, an antenna array, etc.). Other types of load 26 may alternatively be used. The power amplifier 10 also includes two inter-stage matching networks 20, 22 to provide a match between successive stages of the amplifier.

The power amplifier 10 is capable of achieving a high level of linearity while maintaining good efficiency by using a dynamic biasing technique. In addition, good efficiency may be maintained at all power levels instead of falling off when the output power is backed off from its peak value. As illustrated in FIG. 1, in one approach, adaptive dynamic biasing circuitry 28 may be provided for controlling the bias current level of the transistors within the driver and final stages 14, 16 based on a signal level measured within the pre-driver stage 12. Because the driver and final stages 14, 16 typically consume the most DC power, gains in efficiency can be achieved by optimally biasing these stages based on signal level. In at least one embodiment of the invention, the entire power amplifier 10, including the adaptive dynamic biasing circuitry 28, is implemented upon a single semiconductor chip. The load 26 may be coupled to the chip externally.

In at least one embodiment of the invention, the adaptive dynamic biasing circuit 28 is configured to bias transistors within the driver and final stages 14, 16 of the power amplifier 10 for class B or class AB operation when an output power level of the transistors is well below a 1 db gain compression point. As the transistors of the driver and final stages 14, 16 start to approach saturation (i.e., gain starts to approach the 1 dB compression point), non-linearities start to increase rapidly within the power amplifier 10. As these transistors start to approach saturation, the adaptive dynamic biasing circuit 28 starts to adaptively bias the transistors more toward class A operation, in a dynamic manner. This increases the linearity of operation (because class A operation is typically highly linear) without a corresponding decrease in efficiency (because efficiency typically peaks near saturation). In affect, as power increases, the decrease in efficiency caused by changing toward class A operation is offset by the increase in efficiency as the transistor approaches saturation and the increase in linearity caused by changing toward class A operation is offset by the decrease in linearity as the transistor approaches saturation. The overall effect is that linearity and efficiency are more uniform with power level. The dynamic biasing may be used to improve efficiency by pushing the 1 dB output power compression point higher. The dynamic biasing may also be used to make the power amplifier more linear at power levels close to the compression point. This makes it possible to improve efficiency without sacrificing linearity.

When these transistors fall below saturation (e.g., the output power eventually decreases from the compression point), the biasing is moved back toward class B operation in a dynamic manner. This achieves a higher efficiency (because class B operation is more efficient than class A or class AB), while having little effect on linearity (because operation is moving away from the compression point). Thus, as power decreases, the decrease in efficiency as the transistor moves away from saturation is offset by the increase in efficiency caused by changing toward class B operation.

Referring back to FIG. 1, in one approach, the adaptive dynamic biasing circuit 28 first detects a drain current flowing in the pre-driver stage 12 to get an indication of the power levels that the driver and finals stages 14, 16 will be operating at. A detector may be used to, for example, measure a present current level in the pre-driver stage 12. The dynamic biasing circuit 28 may then use this information to develop a biasing control signal to be delivered to the transistors in the driver and final stages 14, 16. If FETs are being used as power devices, for example, the dynamic biasing circuit 28 may generate appropriate gate voltages to apply to the FETs to move the operation of the FETs from class B or AB operation toward class A operation when the power levels in the transistors are increasing toward saturation. Similarly, the adaptive dynamic biasing circuit 28 may generate gate voltages to apply to the FETs to move the operation of the FETs from class A or AB operation toward class B operation when the power levels in the transistors are decreasing away from saturation.

Figure 2:
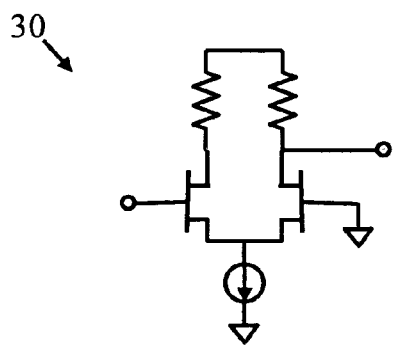
FIG. 2 is a schematic diagram illustrating a current mirror circuit that may be used as a dynamic bias control device in accordance with an embodiment of the present invention.
Figure 3:
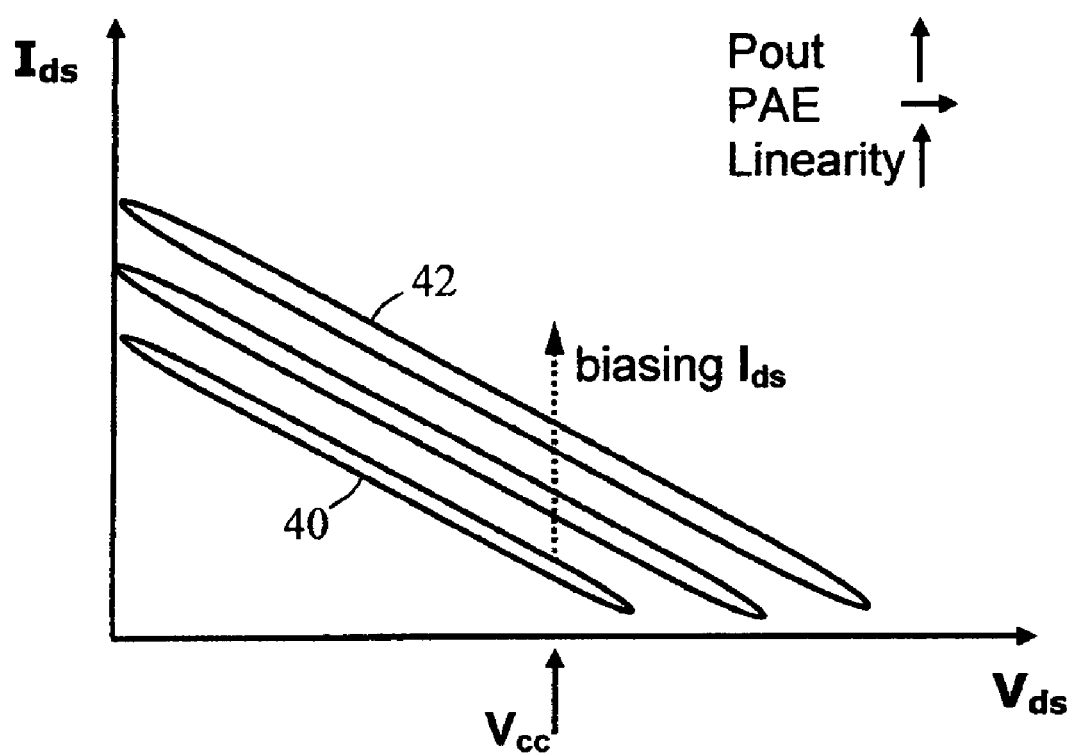
FIG. 3 is a diagram illustrating how a load line may change during dynamic bias control in accordance with an embodiment of the present invention.

In affect, the bias modifications may move the load line of the transistors either up or down, without effecting the slope of the load line. This effect is illustrated in FIG. 3 for an increasing power level. As shown, a first load line 40 may represent biasing when a transistor is operating in class AB. As the power level of operation increases toward saturation, the gate voltage bias is modified and the load line moves vertically toward load line 42. In this manner, linearity is increased while efficiency remains relatively constant. When the power level again decreases, the biasing may cause the load line to move downward toward load line 40. In at least one embodiment, the dynamic biasing circuit 28 includes a current mirror circuit to mirror the current detected in the pre-driver stage 12 into the later stages at the appropriate levels. FIG. 2 illustrates a current mirror circuit that may be used.

Figure 4:
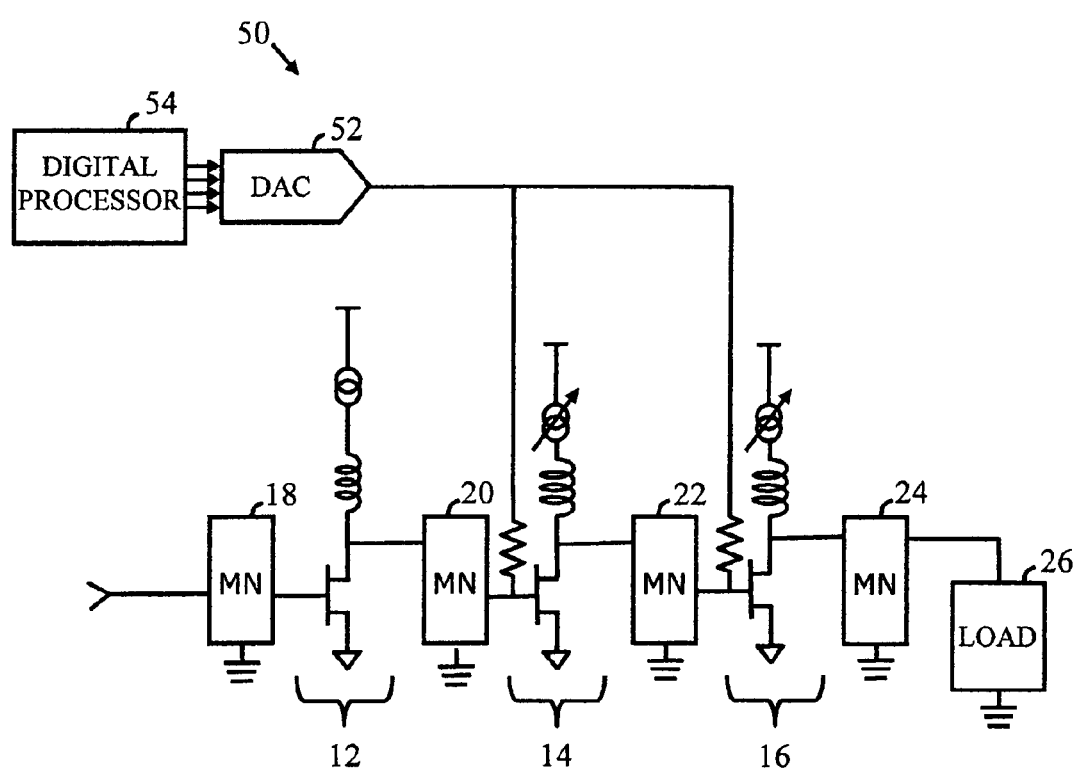
FIG. 4 is a block diagram illustrating an example power amplifier using digital assistance dynamic bias control in accordance with an embodiment of the present invention.

FIG. 4 is a block diagram illustrating an example power amplifier 50 in accordance with another embodiment of the present invention. As before, the power amplifier 50 is a three stage amplifier having a pre-driver stage 12, a driver stage 14, and a final stage 16. The amplifier 50 also includes matching networks 18, 20, 22, 24 as described previously. As in the power amplifier 10 of FIG. 1, the power amplifier 50 dynamically controls the biasing of the driver and final stages 14, 16 based on the power levels that these stages will be processing. However, instead of using adaptive dynamic biasing circuitry 28 as shown in FIG. 1, the power amplifier 50 of FIG. 4 receives dynamic biasing control information from an off chip (or on chip) digital processor 54 (e.g., baseband processor, etc.). Any type of processor may be used including, for example, a general purpose microprocessor, a digital signal processor (DSP), a field programmable gate array (FPGA), a reduced instruction set computer (RISC), a complex instruction set computer (CISC), an application specific integrated circuit (ASIC), a microcontroller, and/or others.

As shown in FIG. 4, a digital-to-analog converter (DAC) 52 may be provided on-chip to convert digital control signals from the processor 54 to analog bias signals for delivery to the driver and final stages 14, 16 of the amplifier 50. The processor 54 may have knowledge of the power levels that are to be present in each stage of the power amplifier 50 at each point in time. The processor 54 may use this knowledge to generate the bias controls. When field effect transistors are being used within the power amplifier 50, as in the illustrated embodiment, the processor 54 may generate gate voltage bias levels for use in the second and third stages of the power amplifier 50. The DAC 52 may then convert the digital gate voltage level information to analog voltage bias signals for delivery to the gate terminals of the corresponding transistors.

When the transistors within the driver or final stages 14, 16 of the power amplifier 50 approach saturation, the processor 54 can cause the transistors within these stages to shift from class AB or B operation toward the more linear class A operation. The decrease in efficiency that occurs when moving toward class A operation is compensated by the increase in efficiency that occurs when moving toward saturation. Similarly, when the power levels of the driver or final stages 14, 16 decrease from saturation, the processor 54 can cause the transistors within these stages to shift from class A or AB operation back toward class B operation. The decrease in efficiency that occurs when moving away from saturation in this case is compensated by the increase in efficiency that occurs when moving toward class B operation. As before, the bias adjustments may move the load lines on the v-i plot up or down to adjust the class of operation. It should be appreciated that features of the invention may be implemented in any multi-stage power amplifier and are not limited to use with three stage amplifiers. For example, in at least one embodiment, a two stage amplifier is used and the bias levels in only the final stage are dynamically controlled. In some other embodiments, a three stage amplifier is used and the bias level in only the final stage is dynamically controlled.

Figure 5:
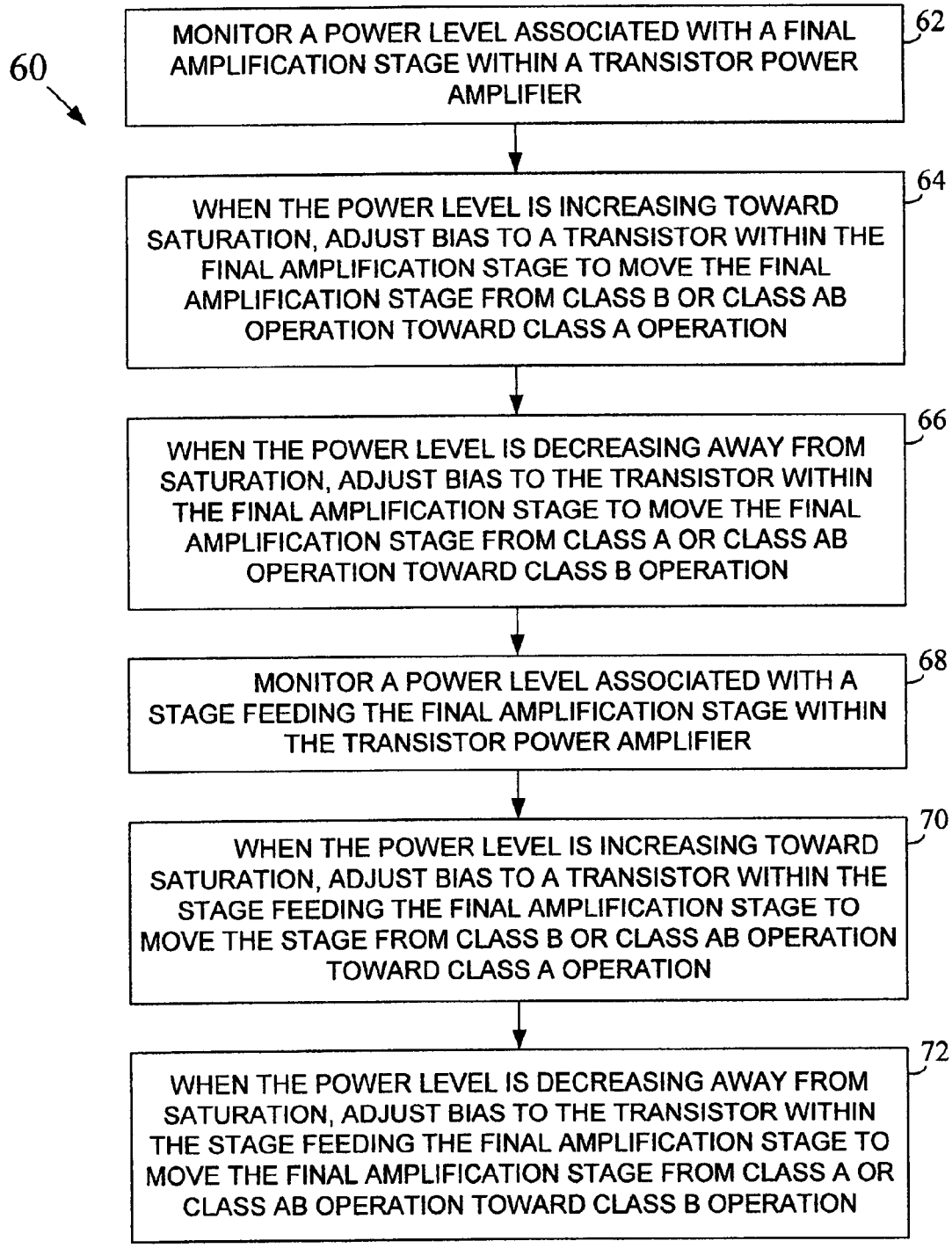
FIG. 5 is a flowchart illustrating an example method for performing dynamic bias control in a power amplifier in accordance with an embodiment of the present invention.

FIG. 5 is flowchart illustrating an example method 60 for performing dynamic bias control in a power amplifier in accordance with an embodiment of the present invention. A power level associated with a final amplification stage in a power amplifier is first monitored (block 62). In one approach, this monitoring may be performed by monitoring a current level within a first stage of the amplifier to determine the power level that the final stage will be processing. In another possible approach, a digital processor (e.g., a baseband processor within a communication device, etc.) may use knowledge it has of the power levels to be transmitted to monitor the power level of the final stage. When the power is increasing toward saturation, the transistor biasing within the final stage may be dynamically adjusted to move the final stage from class B or class AB operation toward class A operation (block 64). When the power is decreasing away from saturation, the transistor biasing within the final stage may be dynamically adjusted to move the final stage from class A or class AB operation toward class B operation (block 66).

If there is an intermediate stage feeding the final stage of the power amplifier, a power level associated with that stage may also be monitored (although in some embodiments, only the final stage will be subject to dynamic bias control) (block 68). As with the final stage, the transistor biasing within the stage feeding the final stage may be dynamically adjusted to move this stage from class B or class AB operation toward class A operation when the power is increasing toward saturation (block 70). The biasing of this transistor may also be dynamically adjusted to move the stage feeding the final stage from class A or class AB operation toward class B operation when the power is decreasing from saturation (block 72). In at least one embodiment, the above method is stored as instructions in a computer readable medium.

Figure 6:
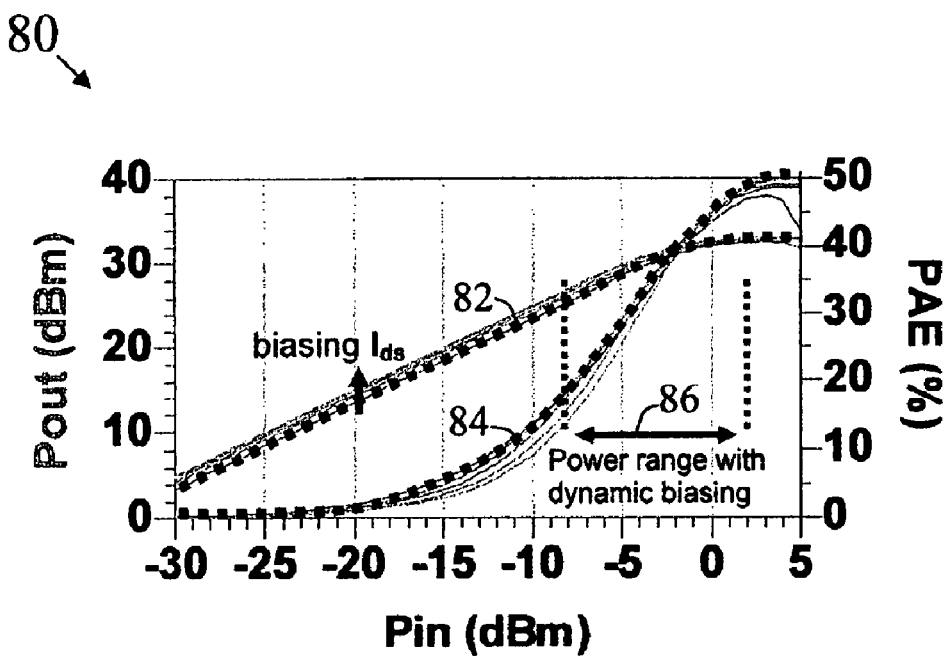
FIG. 6 is a graph illustrating the simulated output power and efficiency versus input power for a 2.5 GHz power amplifier using dynamic bias control in accordance with an embodiment of the present invention.

FIG. 6 is a graph 80 illustrating the simulated output power ($P_{out}$) and efficiency (PAE) versus input power ($P_{in}$) for a 2.5 GHz power amplifier using dynamic bias control in accordance with an embodiment of the present invention. As illustrated, dynamic biasing is limited in this example to the region 86 identified in the graph. The dotted $P_{out}$ curve 82 illustrates the output power that may result when dynamic biasing is used. The dotted PAE curve 84 represents the efficiency that may result when dynamic biasing is used. In this implementation, peak power can be boosted by 3 dB (i.e., doubling the power) with little or no impact on either linearity or efficiency. In addition, the output power can be reduced by 3 dB with little or no impact on efficiency or linearity. In prior art systems, a 3 dB reduction in peak power would normally result in an efficiency reduction of up to 15%.

Figure 7:
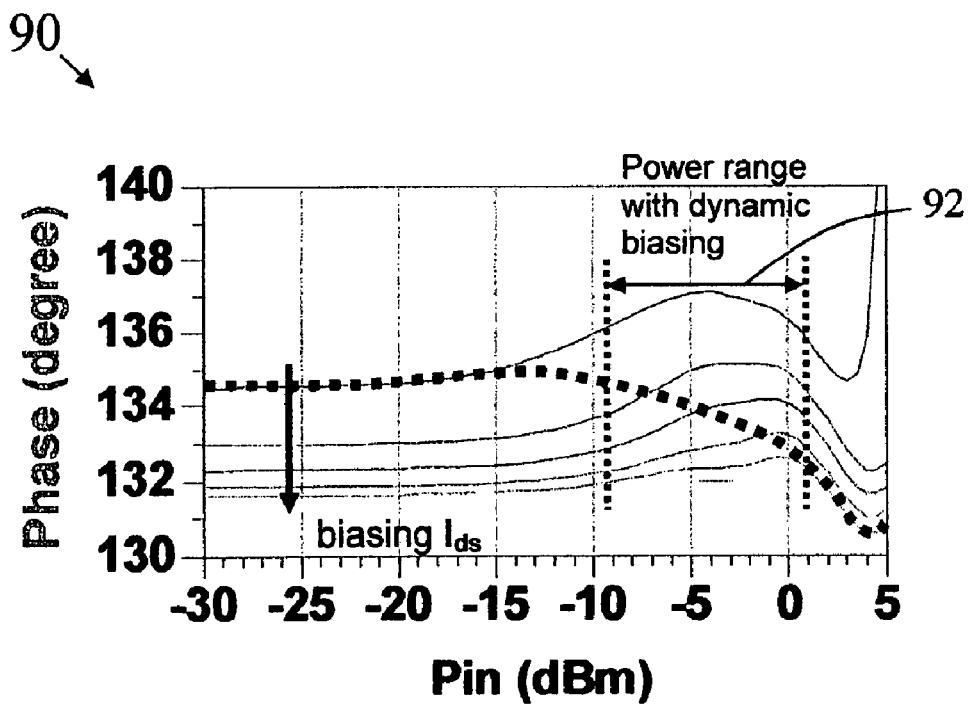
FIG. 7 is a graph illustrating the simulated AM-PM distortion for a 2.5 GHz power amplifier using dynamic bias control in accordance with an embodiment of the present invention.

FIG. 7 is a graph 90 illustrating the simulated AM-PM distortion for a 2.5 GHz power amplifier using dynamic bias control in accordance with an embodiment of the present invention. Again, dynamic biasing is limited in this example to a region 92 identified in the graph. A dotted line 94 represents possible AM-PM distortion using dynamic biasing. The other curves represent AM-PM distortion without using dynamic biasing.

The techniques and structures of the present invention may be implemented in any of a variety of different forms. For example, features of the invention may be embodied within laptop, palmtop, desktop, and tablet computers having wireless capability; personal digital assistants (PDAs) having wireless capability; cellular telephones and other handheld wireless communicators; pagers; satellite communicators; cameras having wireless capability; audio/video devices having wireless capability; network interface cards (NICs) and other network interface structures; base stations; wireless access points; integrated circuits; as instructions stored on machine readable media; and/or in other formats. Examples of different types of machine readable media that may be used include floppy diskettes, hard disks, optical disks, compact disc read only memories (CD-ROMs), digital video disks (DVDs), Blu-ray disks, magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A power amplifier comprising:
at least a first amplification stage and a final amplification stage, said first and final amplification stages each having at least one power transistor;
dynamic biasing circuitry to dynamically bias said at least one power transistor within said final amplification stage based on a power level to be processed by said at least one power transistor within said final amplification stage, wherein said dynamic biasing circuitry moves said at least one power transistor within said final amplification stage from class B or class AB operation toward class A operation when said power level, when increasing, approaches a 1 db compression point;
wherein said adaptive dynamic biasing circuitry includes current mirror circuitry to mirror a current level within said first amplification stage into said final amplification stage.

2. The power amplifier of claim 1, wherein:
said dynamic biasing circuitry moves said at least one power transistor within said final amplification stage from class A or class AB operation toward class B operation when said power level, when decreasing, moves away from said 1 db compression point.

3. The power amplifier of claim 1, further comprising:
at least one intermediate amplification stage between said first amplification stage and said final amplification stage, said at least one intermediate stage including a stage directly driving said final amplification stage, said stage directly driving said final amplification stage including at least one power transistor;
wherein said dynamic biasing circuitry is to dynamically bias said at least one power transistor within said stage directly driving said final amplification stage based on a power level to be processed by said at least one power transistor within said stage directly driving said final amplification stage, wherein said dynamic biasing circuitry moves said at least one power transistor within said stage directly driving said final amplification stage from class B or class AB operation toward class A operation when said power level, when increasing, approaches a 1 db compression point.

4. The power amplifier of claim 3, wherein:
said dynamic biasing circuitry moves said at least one power transistor within said stage directly driving said final amplification stage from class A or class AB operation toward class B operation when said power level, when decreasing, moves away from said 1 db compression point.

5. The power amplifier of claim 1, wherein:
said dynamic biasing circuitry includes adaptive dynamic biasing circuitry that is located on the same semiconductor chip as said first and final amplification stages.

6. The power amplifier of claim 1, wherein:
said dynamic biasing circuitry includes a digital processor that is located external to a semiconductor chip carrying said first and final amplification stages.

7. The power amplifier of claim 1, wherein:
said digital processor is a baseband processor of a corresponding communication device.

8. A method comprising:
monitoring a power level to be output by a final amplification stage within a transistor power amplifier; and
adjusting bias to a transistor within said final amplification stage to move said final amplification stage from class B or class AB operation toward class A operation when said output power, while increasing, approaches a 1 dB compression point;
wherein said transistor power amplifier has three or more amplification stages; and
said method further comprises:
monitor a power level to be output by a stage feeding said final amplification stage within said transistor power amplifier; and
adjusting bias to a transistor within said stage feeding said final amplification stage to move said stage feeding said final amplification stage from class B or class AB operation toward class A operation when said output power, while increasing, approaches a 1 dB compression point.

9. The method of claim 8, further comprising:
adjusting bias to said transistor within said final amplification stage to move said final amplification stage from class A or class AB operation toward class B operation when said output power decreases from said 1 dB compression point.

10. The method of claim 8, wherein:
adjusting bias includes changing a bias voltage being applied to the gate terminal of a field effect transistor.

11. The method of claim 8, wherein:
adjusting bias includes moving a load line on a v-i characteristic up or down in a controlled manner by changing bias, without changing a slope of said load line.

12. The method of claim 8, further comprising:
adjusting bias to said transistor within said stage feeding said final amplification stage to move said final amplification stage from class A or class AB operation toward class B operation when said output power decreases from said 1 dB compression point.

13. The method of claim 8, wherein:
monitoring a power level includes detecting an envelope of a current level within a first stage of said transistor power amplifier.

14. The method of claim 8, wherein:
monitoring a power level includes determining said power level based on information known within a digital baseband processor coupled to said transistor power amplifier.

15. An article comprising a computer readable storage medium having instructions stored thereon that, when executed by a computing platform, operate to:
monitor a power level to be output by a final amplification stage within a transistor power amplifier; and
adjust bias to a transistor within said final amplification stage to move said final amplification stage from class B or class AB operation toward class A operation when said output power, while increasing, approaches a 1 dB compression point;
wherein said transistor power amplifier has three or more amplification stages; and
said instructions, when executed by said computing platform, further operate to:
monitor a power level to be output by a stage feeding said final amplification stage within said transistor power amplifier; and
adjust bias to a transistor within said stage feeding said final amplification stage to move said stage feeding said final amplification stage from class B or class AB operation toward class A operation when said output power, while increasing, approaches a 1 dB compression point.

16. The article of claim 15, wherein said instructions further operate to:
adjust bias to said transistor within said final amplification stage to move said final amplification stage from class A or class AB operation toward class B operation when said output power decreases from said 1 dB compression point.

17. The article of claim 15, wherein:
operation to adjust bias includes operation to change a bias voltage being applied to the gate terminal of a field effect transistor.

18. The article of claim 15, wherein:
operation to adjust bias includes operation to move a load line on a v-i characteristic up or down in a controlled manner by changing bias without changing a slope of said load line.

19. The method of claim 8, wherein:
monitoring a power level to be output by a final amplification stage, adjusting bias to a transistor within said final amplification stage, monitoring a power level to be output by a stage feeding said final amplification stage, and adjusting bias to a transistor within said stage feeding said final amplification stage are performed by dynamic biasing circuitry within said transistor power amplifier.

* * * * *